(12) United States Patent
Bahramshahry et al.

(10) Patent No.: US 10,332,569 B2
(45) Date of Patent: *Jun. 25, 2019

(54) SYSTEM AND METHOD FOR DYNAMIC CACHING

(71) Applicant: salesforce.com, inc., San Francisco, CA (US)

(72) Inventors: Armin Bahramshahry, Vancouver (CA); Piranavan Selvanandan, San Francisco, CA (US)

(73) Assignee: salesforce.com, inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/866,142

(22) Filed: Jan. 9, 2018

(65) Prior Publication Data
US 2018/0137898 A1  May 17, 2018

Related U.S. Application Data

(63) Continuation of application No. 14/686,076, filed on Apr. 14, 2015, now Pat. No. 9,865,313.

(60) Provisional application No. 62/040,523, filed on Aug. 22, 2014.

(51) Int. Cl.
G06F 15/16 (2006.01)
G11C 7/10 (2006.01)
G06F 16/172 (2019.01)

(52) U.S. Cl.
CPC .......... G11C 7/1072 (2013.01); G06F 16/172 (2019.01)

(58) Field of Classification Search
CPC .................. G11C 7/1072; G06F 17/30132
USPC .................................. 709/217, 224
See application file for complete search history.

(56) References Cited

U.S. PATENT DOCUMENTS

| | | | | |
|---|---|---|---|---|
| 9,865,313 | B2* | 1/2018 | Bahramshahry | G06F 17/30132 |
| 2004/0107319 | A1* | 6/2004 | D'Orto | G06F 17/30902 711/133 |
| 2008/0154903 | A1* | 6/2008 | Crowley | G06F 17/30194 |

* cited by examiner

*Primary Examiner* — Philip B Tran
(74) *Attorney, Agent, or Firm* — Lorenz & Kopf, LLP (57) ABSTRACT

In one embodiment, a computer-implemented method executable by a server system to store data in a data cache and refresh the data based on a dynamic schedule is provided. The method includes: receiving, by a processor, data from a first resource; storing, by the processor, the data in a data cache; determining, by the processor, a type of the data, and an access frequency of the data; determining, by the processor, a dynamic schedule based on the type of the data, and the access frequency of the data; and refreshing the data cache with new data from the first resource based on the dynamic schedule.

20 Claims, 6 Drawing Sheets

SYSTEM AND METHOD FOR DYNAMIC CACHING

CROSS-REFERENCE TO RELATED APPLICATION

This application is a continuation of U.S. application Ser. No. 14/686,076, filed on Apr. 14, 2015, which claims the benefit of U.S. Provisional Application No. 62/040,523, filed Aug. 22, 2014, which is hereby incorporated by reference in its entirety.

TECHNICAL FIELD

Embodiments of the subject matter described herein relate generally to methods and systems for caching data. More particularly, embodiments of the subject matter relate to methods and systems for caching data based on a dynamic schedule.

BACKGROUND

In services that provide views of certain resources from other services, information is polled from the other services. When polling the information upon request, the process may be slow and expensive. In order to resolve this issue, a data cache may be established to poll and store data from the other services. The polling and storing is performed as a background job. In some instances, cache updates may be performed for groups of data. However, users may have to wait for the entire cache cycle for the group to finish before receiving an updated view of a specific item within the group's cache data.

Accordingly, it is desirable to provide a caching process that minimizes this wait issue. Furthermore, other desirable features and characteristics will become apparent from the subsequent detailed description and the appended claims, taken in conjunction with the accompanying drawings and the foregoing technical field and background.

SUMMARY

In one embodiment, a computer-implemented method executable by a server system to store data in a data cache is provided. The method includes: receiving, by a processor, data from a first resource; storing, by the processor, the data in a data cache; determining, by the processor, a type of the data, and an access frequency of the data; determining, by the processor, a dynamic schedule based on the type of the data, and the access frequency of the data; and refreshing the data cache with new data from the first resource based on the dynamic schedule.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely exemplary in nature and is not intended to limit the disclosure the application and uses of the disclosure. Furthermore, there is no intention to be bound by any expressed or implied theory presented in the preceding technical field, background, brief summary or the following detailed description. It should be understood that throughout the drawings, corresponding reference numerals indicate like or corresponding parts and features.

The exemplary embodiments presented here relate to a caching system and related techniques, methodologies, procedures, and technology for data caching. As can be appreciated, the described subject matter can be implemented in the context of various environments. For exemplary purposes, the subject matter is described in the context of a computer-implemented environment relating to, for example, software products for a software-based system, a database system, a multi-tenant environment, or the like. Moreover, the described subject matter can be implemented in connection with two or more separate and distinct computer-implemented systems that cooperate and communicate with one another.

In accordance with exemplary embodiments described below, a computer based system is provided, such as a multi-tenant system that is used to provide a service to a plurality of different tenants, a plurality of different end users, and/or a plurality of different tenant applications. In various embodiments, the service provides aggregated views of certain other services information. The other services information is polled from resources associated with the other services. The resources may be a part of the multi-tenant system and/or a separate from the multi-tenant system. The caching system of the present disclosure generally provides a data cache that selectively polls and stores the other services information based on a dynamic schedule. The caching system selectively polls and stores the other services information such that wait times for results is minimized.

Figure 1:
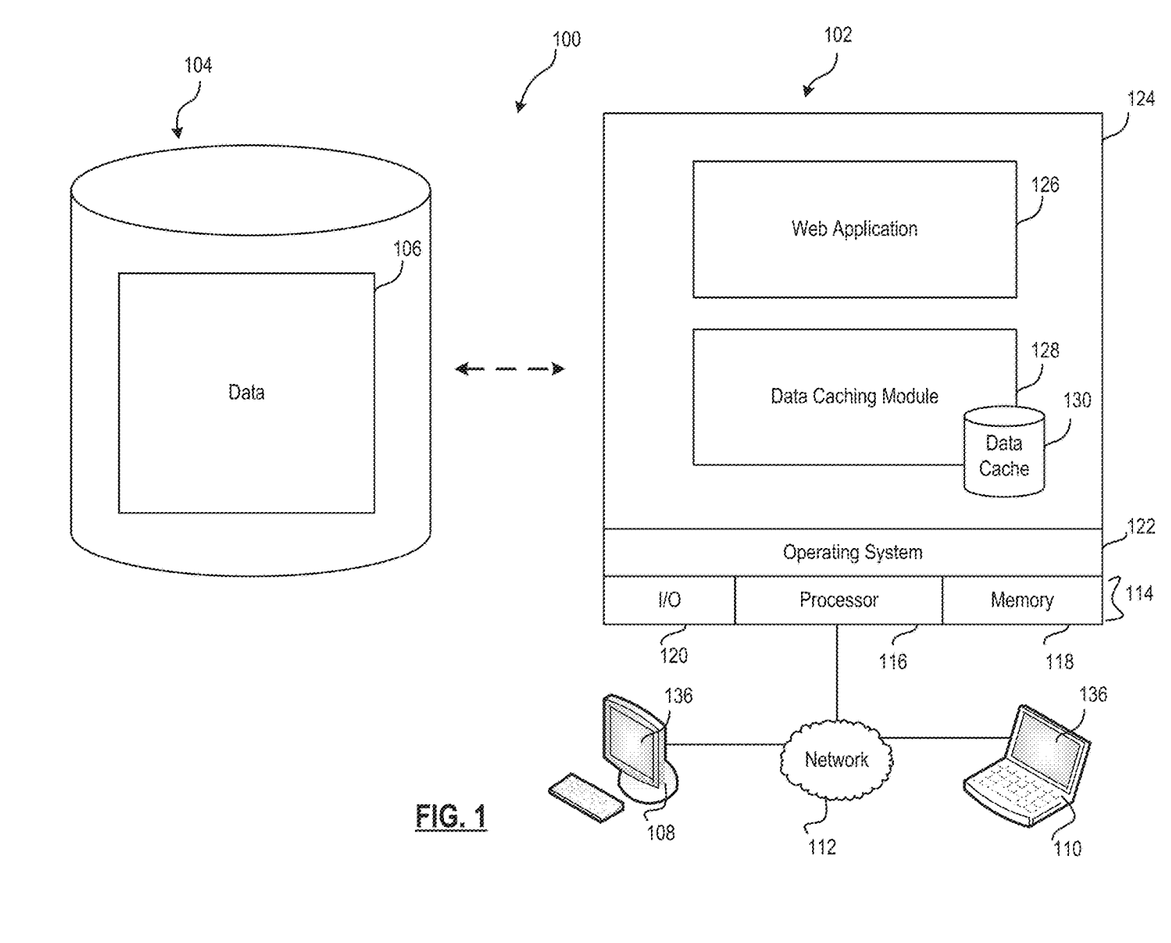
FIG. 1 is a block diagram of an exemplary data processing system having a caching system in accordance with various embodiments.

Turning now to FIG. 1, an exemplary computing system 100 having a caching system is shown in accordance with various embodiments. The computing system 100 generally includes at least one server 102 that is associated with at least one data source 104. In accordance with various non-limiting examples, the system 100 may be implemented in the form of a multi-tenant customer relationship management system that can support any number of authenticated users of multiple tenants. A "tenant" or an "organization" generally refers to a group of users that shares access to common data 106 within the data source 104. Tenants may represent customers, customer departments, business or legal organizations, and/or any other entities that maintain data for particular sets of users within the system 100. Although multiple tenants may share access to the server 102 and the data source 104, the particular data and services provided from the server 102 to each tenant can be securely isolated from those provided to other tenants. The multi-tenant architecture therefore allows different sets of users to share functionality while managing the sharing of any or none of the data 106. The users and/or tenants share access through one or more virtual machines 108, 110 or other computing devices that communicate with the server 102 via a network 112.

The server 102 generally includes any sort of conventional processing hardware 114, such as a processor 116, memory 118, input/output features 120 and the like, that are managed and accessed by a suitable operating system 122. The processor 116 may be implemented using one or more of microprocessors, microcontrollers, processing cores and/or other computing resources spread across any number of distributed or integrated systems, including any number of "cloud-based" or other virtual systems. The memory 118 represents any non-transitory short or long term storage capable of storing programming instructions for execution on the processor 116, including any sort of random access memory (RAM), read only memory (ROM), flash memory, magnetic or optical mass storage, and/or the like. The input/output features 120 represent conventional interfaces to networks (e.g., to a network 112, or any other local area, wide area or other network), mass storage, display devices, data entry devices and/or the like. As can be appreciated, the server 102 may be implemented using a cluster of actual and/or virtual servers operating in conjunction with each other, typically in association with conventional network communications, cluster management, load balancing and other features as appropriate.

The server 102 typically includes or cooperates with some type of computer-readable media 124, where a tangible computer-readable medium has computer-executable instructions stored thereon. The computer-executable instructions, when read and executed by the server 102, cause the server 102 to perform certain tasks, operations, functions, and processes described in more detail herein. In this regard, the memory 118 may represent one suitable implementation of such computer-readable media. Alternatively or additionally, the server 102 could receive and cooperate with computer-readable media (not separately shown) that is realized as a portable or mobile component or platform, e.g., a portable hard drive, a USB flash drive, an optical disc, or the like.

The data source 104 is any sort of repository or other data storage system capable of storing and managing the data 106 associated with any number of tenants. The data source 104 may be implemented using any type of conventional database server hardware. In various embodiments, the data source 104 shares processing hardware 114 with the server 102. In other embodiments, the data source 104 is implemented using separate physical and/or virtual database server hardware that communicates with the server 102 to perform the various functions described herein.

In various embodiments, the computer-readable media 124 associated with the server 102 includes at least one web application 126 and a data caching module 128 associated with the web application 126 in accordance with the present disclosure. The web application 126 includes computer-executable instructions that, when executed by the processor 116 of the server 102, allows the users to access data from resources such as the server 102, the data source 104, or from other virtual machines 108, 110 through, for example, one or more web pages.

The data caching module 128 includes computer-executable instructions that, when executed by the processor 116 of the server 102, selectively polls and stores data from the various resources in a data cache 130. In operation, the data caching module 128 generates one or more requests to cache data based on a dynamic schedule. The data caching module 128 determines the dynamic schedule based on one or more of a type or class of the data, an access frequency of the data, and an age of the data.

Figure 2:
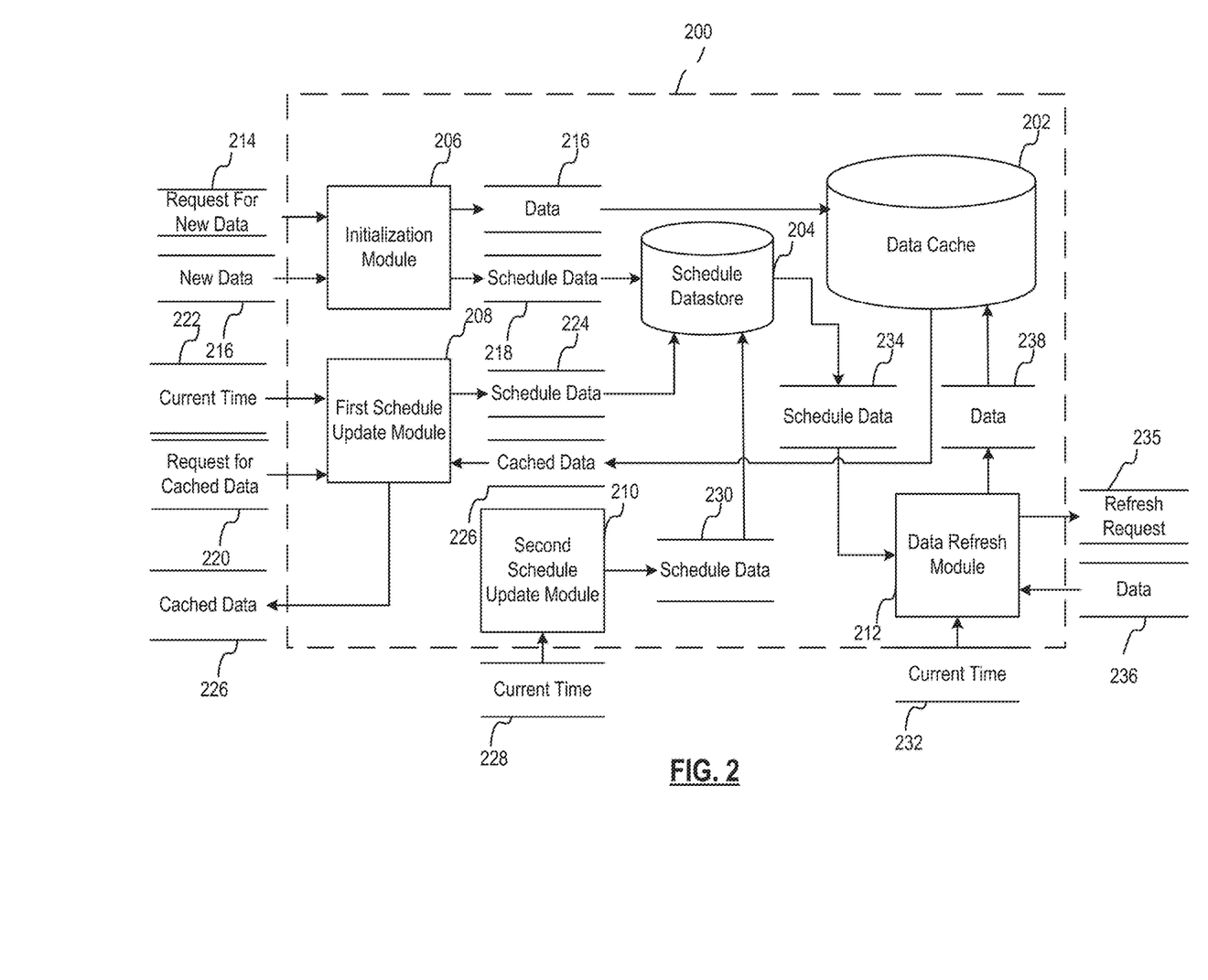
FIG. 2 is a dataflow diagram illustrating an caching system in accordance with various embodiments.
Figure 3:
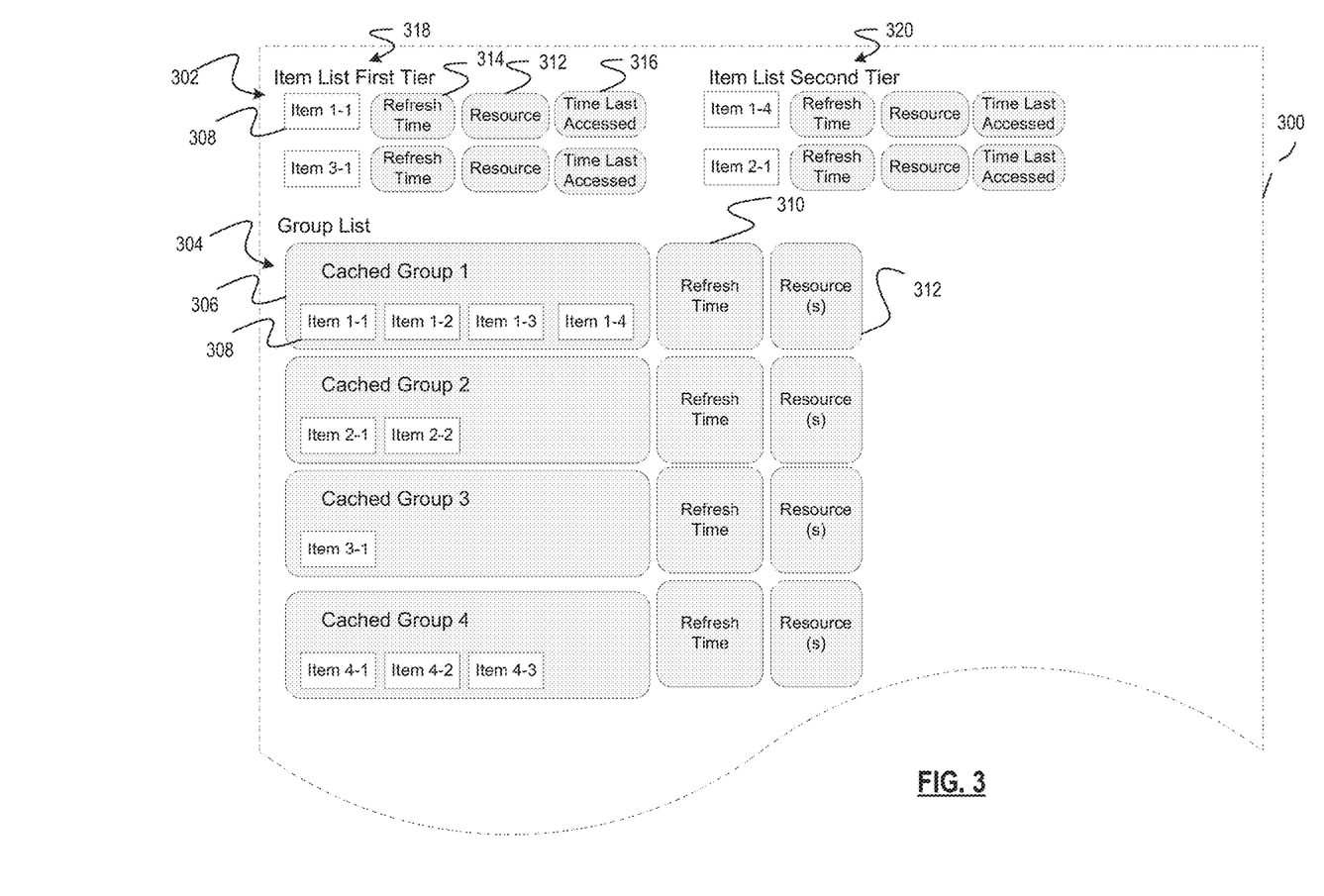
FIGS. 3-7 are flowcharts illustrating exemplary caching methods in accordance with various embodiments.

Referring now to FIGS. 2 and 3 and with continued reference to FIG. 1, a block diagram illustrates an exemplary data caching module 200 suitable for use in a computer-implemented server system such as the system 100 shown in FIG. 1. As can be appreciated, various exemplary embodiments of the data caching module 200, according to the present disclosure, may include any number of sub-modules. In various exemplary embodiments, the sub-modules shown in FIG. 2 may be combined and/or further partitioned to selectively cache data. In various exemplary embodiments, the data caching module 200 includes a data cache 202, a schedule datastore 204, an initialization module 206, a first schedule update module 208, a second schedule update module 210, and a data refresh module 212.

The data cache 202 stores data from the various resources. The data may be stored for a particular user and/or amongst multiple users of the system 100. The schedule datastore 204 stores a dynamic schedule 300 (FIG. 3) for refreshing the data stored in the data cache 202 with data from the resources. As will be discussed in more detail below, the dynamic schedule 300 (FIG. 3) includes, but is not limited to, a list of items to be refreshed shown generally at 302 (FIG. 3), and a list of groups 304 to be refreshed shown generally at 304 (FIG. 3).

The initialization module 206 receives as input a request for new data 214. The request for new data 214 is a request for data from a resource or resources The request for new data 214 may be generated, for example, based on a user's interaction with a web page of the web application. The requested data is new data to be cached and may include files or any other type of information from a resource or resources that are associated with a particular service. In response to the request for new data 214, the initialization module 206 receives the new data 216 from the resource or resources.

The initialization module 206 determines a type or class (hereinafter referred to as the type) of the new data 216 based on the request for data 214 or the new data 216 itself. In various embodiments, the type may be determined based on the resource or resources the data 216 is from, the type of the data 216, and/or the behavior of the data 216.

The initialization module 206 then generates and stores schedule data 218 in the dynamic schedule 300 of schedule datastore 204 based on the determined type. The schedule data 218 is stored in the list of groups 304 to be refreshed. In various embodiments, as shown in FIG. 3, the schedule data 218 includes a group identifier 306, a group item identifier 308, a refresh time 310, and an identifier 312 of the resource or resources from which the data 216 (FIG. 2) was received. For example, the initialization module 206 (FIG. 2) may designate as the identifiers 306, 308 for the data 216 (FIG. 2): "Group 1" and "Item 1-1" respectively. In another example, the initialization module 206 may set the refresh time 310 for the data 216 based on a predetermined time associated with that type, group, or resource. The refresh time 310 indicates a time when the data in the data cache is to be updated from data in the resource. For example, Groups 1-5 may all be assigned a refresh time of 5 minutes. In another example, Group 1 may be assigned a refresh time of 5 minutes; Group 2 may be assigned a refresh time of 15 minutes; Group 3-4 may be assigned a refresh time of 30 minutes; and so on.

The initialization module 206 stores the group identifier 306, the group item identifier 308, the refresh time 310, and an identifier 312 of the resource or resources from which the data 216 is from in the dynamic schedule 300 of the schedule datastore 204.

As can be appreciated, as additional data is received from the same or additional resources, the initialization module 206 (FIG. 2) may selectively increment or update the identifiers 306, 308 and associate the incremented identifiers with the additional data. For example, the initialization module 206 may associate with a second set of data from the resource or of the same type: "Group 1" and "Item 1-2." In another example, the initialization module 206 may associate with a first set of data from a second resource or having a second type: "Group 2" and "Item 2-1." As can be appreciated, in various embodiments, any type of identifier technique may be used including more descriptive identifiers, as the disclosure is not limited to the present examples.

Once the schedule data 218 has been stored in the schedule datastore 204, the initialization module 206 stores the data 216 in the data cache 202 based on, for example, the group identifier 306 (FIG. 3) and the group item identifier 308 (FIG. 3).

The first schedule update module 208 receives as input a request for cached data 220, and a current time 222. Based on the request for cached data 220, the first schedule update module 208 selectively updates the list of items 302 to be refreshed in the dynamic schedule 300 with schedule data 224. For example, if the request for cached data 220 is a frequent request for the same data (e.g., based on a frequency of the request for a particular user or amongst multiple users), the first schedule update module 208 generates and stores schedule data 224. The schedule data 224 is added to the list of items 302 to be refreshed. For example, as shown in FIG. 3, the first schedule update module 208 adds the item associated with the cached data to the list of items 302 by storing the schedule data 218 associated with the data including, but not limited to, and the group item identifier 308, and identifiers 312 of the resource or resources, a new refresh time 314, and a time accessed 316. The new refresh time 314 includes a faster refresh time from the refresh time 310 associated with the group. The time accessed 316 is the current time 222.

In various embodiments, the list of items 302 can include multiple tiers 318, 320, each tier 318, 320 being associated with a refresh time or a range of refresh times. In such embodiments, the first schedule update module 208 adds the schedule data 224 including the group item identifier 308 and the identifiers 312 of the resource or resources, the new refresh time 314, and the time accessed 316 to a first tier 318 of the list of items 302. As or after the schedule data 224 is being stored in the schedule datastore 204, the cached data 226 is retrieved from the data cache 202 and presented to the requestor.

The second schedule update module 210 receives as input a current time 228. The second schedule update module 210 evaluates each item in the list of items 302 and selectively moves or removes the items from the list of items 302 (via schedule data 230) based on the current time 228 and the time accessed 316 for each item. For example, the second schedule update module 210 computes an age for each item in the list of items 302 based on, for example, a difference between the current time 228 and the time last accessed 316. The second schedule update module 210 moves or removes the item from the list of items 302 when the computed age is greater than a threshold age according to the type of the data. In various embodiments, when the list of items 302 includes multiple tiers 318, 320, the item may be moved to the next tier (e.g., tier 2, or other tier) when the age is greater than the threshold age; and may be removed from the list of items 302 when the age is greater than a threshold age of a last tier (e.g., tier 2).

The data refresh module 212 receives as input a current time 232 and schedule data 234 from the dynamic schedule 300. The data refresh module 212 compares the current time 232 with the refresh times in the schedule data 234 and generates refresh requests 235 based on the comparison. In response to the refresh requests 235, the data refresh module 212 receives data 236 from the resource(s). The received data 238 is stored in the data cache 202 according to, for example, the group identifier 306 and the item identifier 308.

Turning now to FIGS. 4-7, flowcharts illustrate exemplary methods 400-700 related to the caching of data. The various tasks performed in connection with the methods 400-700 may be performed by software, hardware, firmware, or any combination thereof. In other words, the methods 400-700 may represent a computer-implemented method to cache data. In particular, the methods 400-700 are executable by a suitably configured server system or a functional module of a server system, such as the system 100 described above. For illustrative purposes, the following description of the methods 400-700 may refer to elements mentioned above in connection with FIGS. 1-2. In practice, portions of the methods 400-700 may be performed by different elements of the described system. As can be appreciated, the methods 400-700 may include any number of additional or alternative steps, the steps shown in FIGS. 4-7 need not be performed in the illustrated order, and the methods 400-700 may be incorporated into a more comprehensive procedure or process having additional functionality not described in detail herein. Moreover, one or more of the steps shown in FIGS. 4-7 could be omitted from embodiments of the methods 400-700 as long as the intended overall functionality remains intact.

Figure 4:
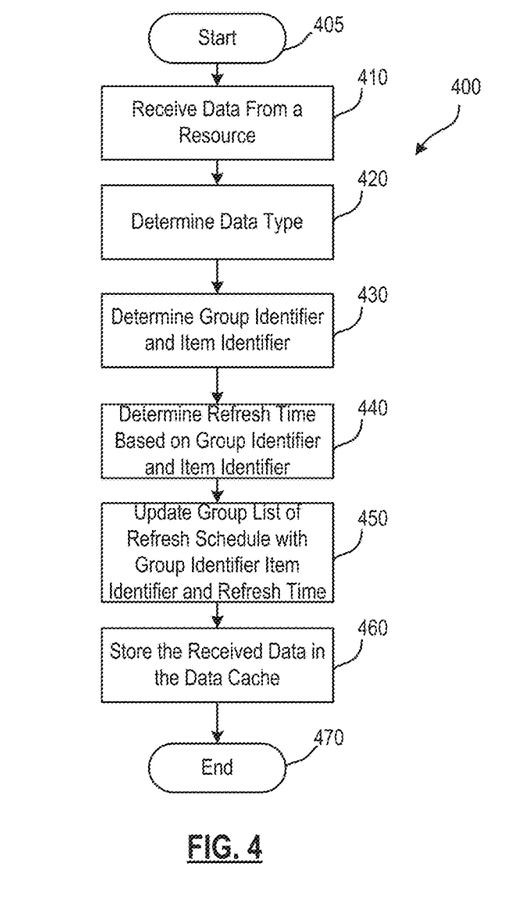

With reference to FIG. 4, a method 400 of initializing the dynamic schedule is provided. The method 400 may begin at 405. The data is received from the resource at 410. The data is evaluated to determine the data type at 420, for example, based on the resource it was received from, the data itself, and/or the behavior of the data. The group identifier and the item identifier are established based on the data type at 430. The refresh time is established based on the group identifier and the item identifier at 440. The group list of the dynamic schedule is updated with the group identifier, the item identifier, and the refresh time at 450. The received data is then stored in the data cache at 460. Thereafter, the method 400 may end at 470.

Figure 5:
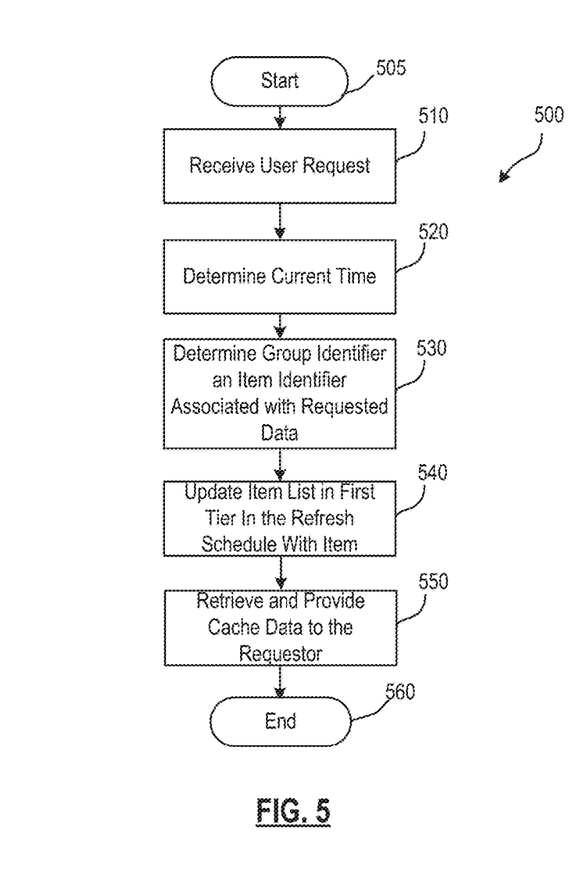

With reference to FIG. 5, a method 500 of updating the dynamic schedule is provided. The method 500 may begin at 505. A request for data (e.g., based on a user's interaction with one or more web pages or other interaction) is received at 510. The current time is determined at 520. The group identifier and the item identifier associated with the data of the request are determined at 530. The first tier of the item list of the dynamic schedule is updated with the item identifier, the refresh time, the resource, and the time accessed (i.e., current time) at 540. The requested data is then retrieved from the data cache and provided to the requestor at 550. Thereafter, the method 500 may end at 560.

Figure 6:
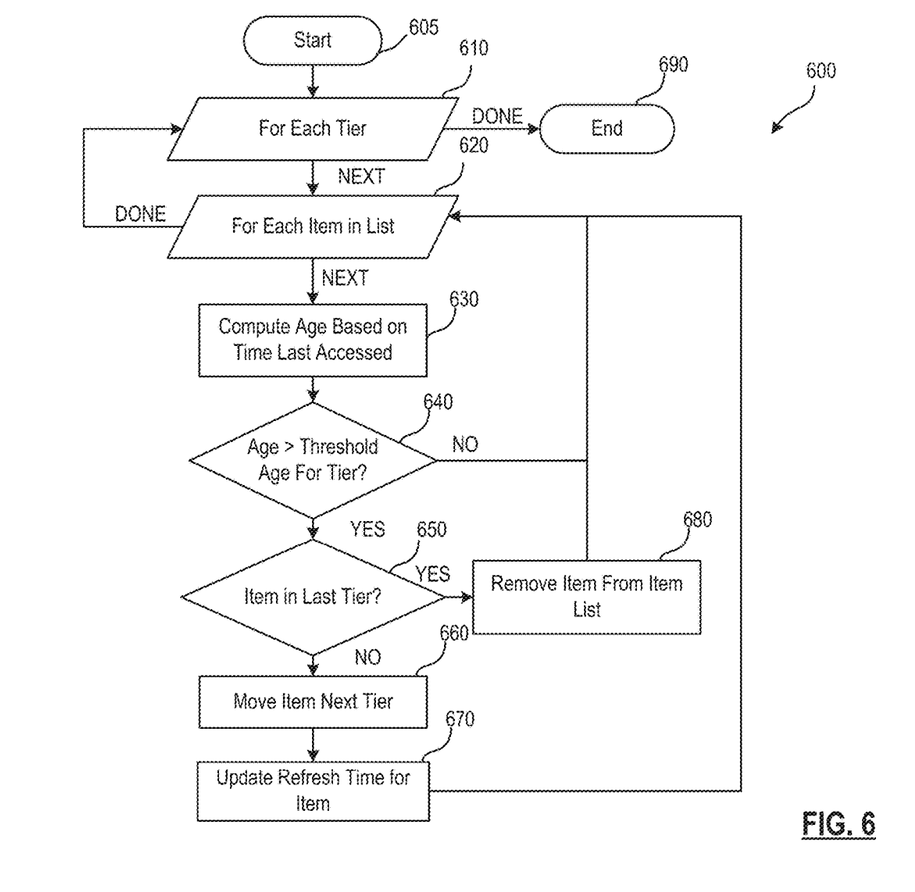

With reference to FIG. 6, a method 600 of updating the dynamic schedule is provided. The method 600 may begin at 605. The time last accessed for each item of each tier of the dynamic schedule is evaluated at 610 to 680. For example, for each tier at 610, and each item of each tier at 620, an age is computed based on the current time at 630 and evaluated at 640. If the age of the item is greater than a threshold age associated with the tier at 640, and the time is not currently in the last tier at 650, then the item information is moved to the next tier (e.g., tier 2) at 660 and the refresh time associated with the item is changed based on the new tier at 670. If, however, the item is currently in the last tier at 650, the item is removed from the last tier (as it will be updated based on its association with the group in the group list) at 680.

The method 600 continues until all of the items in the item list and for each tier have been evaluated. Thereafter, the method 600 may end at 690.

Figure 7:
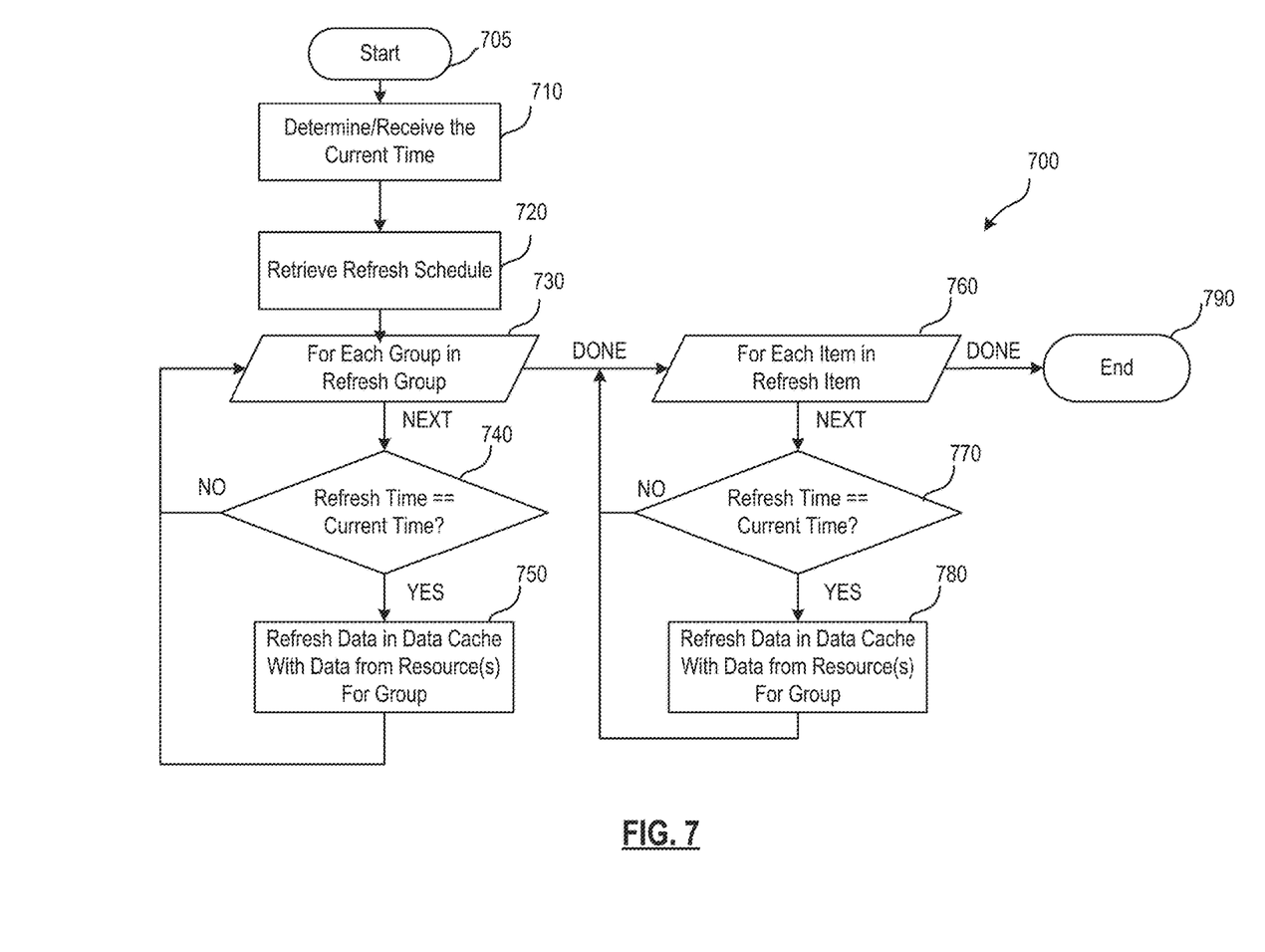

With reference to FIG. 7, a method 700 of managing the dynamic schedule is provided. The method 700 may begin at 705. The current time is determined/received at 710. The dynamic schedule is retrieved at 720, and each group in the dynamic schedule is evaluated at 730-750. For example, for each group in the list of refresh groups in the dynamic schedule at 730, the refresh time is evaluated at 740. If the refresh time for the group is equal to the current time (e.g., or an increment of the refresh time) at 740, then the data in the data cache is refreshed from the resource or resources for each item in the group at 750. If however, the refresh time is not equal to the current time at 740, the method 700 continues with evaluating the refresh time for the next group at 730.

Once the refresh times for all of the groups in the list of refresh groups have been evaluated at 730, each item in the list of refresh items is evaluated at 760-780. For example, for each item in the list of refresh items in the dynamic schedule at 760, the refresh time is evaluated at 770. If the refresh time for the item is equal to the current time (e.g., or an increment of the refresh time) at 770, then the data in the data cache is refreshed from the resource for the particular item at 780. If however, the refresh time is not equal to the current time at 770, the method 700 continues with evaluating the refresh time for the next item at 760.

Once the refresh times for all of the items in the list of refresh items have been evaluated at 760, only then the method 700 may end at 790.

The foregoing detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or instructions that perform the various tasks. The program or code segments can be stored in a processor-readable medium or transmitted by a computer data signal embodied in a carrier wave over a transmission medium or communication path. The "processor-readable medium" or "machine-readable medium" may include any medium that can store information. Examples of the processor-readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, or the like. The computer data signal may include any signal that can propagate over a transmission medium such as electronic network channels, optical fibers, air, electromagnetic paths, or RF links. The code segments may be downloaded via computer networks such as the Internet, an intranet, a LAN, or the like.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A computer-implemented method executable by a server system to store data in a data cache, the method comprising:
   receiving, by a processor, data from a first resource;
   storing, by the processor, the received data in the data cache;
   evaluating, by the processor, the received data to determine an attribute of the data;
   assigning, by the processor, the received data to one of a plurality of data groups based upon the determined attribute of the data, wherein each of the data groups is associated with an access frequency;
   updating, by the processor, a dynamic schedule to refresh the received data in the data cache based on the access frequency associated with the group to which the received data is assigned; and
   refreshing the data cache to thereby replace the received data stored in the data cache with new data from the first resource based on the updated dynamic schedule.

2. The method of claim 1, wherein the attribute of the data is a level of privacy for the data so that the data in the data cache is refreshed based upon the level of privacy of the data.

3. The method of claim 1, wherein the attribute comprises at least one of a group identifier and an item identifier based on a type of the data, and wherein the dynamic schedule is determined based on the group identifier and the item identifier.

4. The method of claim 3, wherein the dynamic schedule has different refresh times associated with different group identifiers.

5. The method of claim 3, wherein the dynamic schedule has different refresh times associated with at least two different item identifiers.

6. The method of claim 5, wherein the dynamic schedule has different refresh times associated with at least two different item identifiers having a same group identifier.

7. The method of claim 1 wherein the attribute is an age associated with the stored data, and wherein the dynamic schedule is determined based on the age.

8. The method of claim 7, wherein the age is an access age that is based on a current time and a time last accessed.

9. The method of claim 8, further comprising receiving a request to access cached data, and determining the time last accessed based on the request to access cached data.

10. The method of claim 7, wherein the age is determined for on an item of a group.

11. The method of claim 1, wherein the dynamic schedule includes a list of items to be refreshed and a list of groups to be refreshed.

12. The method of claim 11, wherein the list of items to be refreshed includes multiple tiers.

13. The method of claim 12, wherein each tier of the multiple tiers is associated with a different refresh time or a different range of refresh times.

14. The method of claim 13, further comprising determining a tier of the multiple tiers for listing an item based on at an access time.

15. The method of claim 13, further comprising determining a tier of the multiple tiers for listing an item based on at an access age.

16. The method of claim 13, further comprising removing an item from the list of items based on an access age.

17. A computer program product for caching data in a data cache, comprising:
a non-transitory computer-readable storage medium that is readable by a processing circuit and that stores instructions for execution by the processing circuit to thereby perform an automated process, wherein the automated process comprises:
receiving, by the processing circuit, data from a first resource;
storing, by the processing circuit, the received data in the data cache;
evaluating, by the processing circuit, the received data to thereby determine an attribute of the data;
assigning, by the processing circuit, the received data to one of a plurality of data groups based upon the determined attribute of the data, wherein each of the data groups is associated with an access frequency of the data;
updating, by the processing circuit, a dynamic schedule to refresh the received data in the data cache based on the access frequency of the data associated with group to which the received data is assigned; and
refreshing the data cache to thereby replace the data with new data from the first resource based on the dynamic schedule.

18. The computer program product of claim 17 wherein the attribute of the data is a level of privacy for the data so that the data in the data cache is refreshed based upon the level of privacy of the data.

19. A data caching system comprising a non-transitory computer-readable storage medium that stores instructions for execution by a processing circuit for performing an automated process that comprises:
receiving, by the processing circuit, data from a first resource;
storing, by the processing circuit, the received data in the data cache;
evaluating, by the processing circuit, the received data to thereby determine a type of the data;
assigning, by the processing circuit, the received data to one of a plurality of data groups based upon the determined type of the data, wherein each of the data groups is associated with an attribute of the data;
updating, by the processing circuit, a dynamic schedule to refresh the received data in the data cache based on the attribute of the data associated with group to which the received data is assigned; and
refreshing the data cache to thereby replace the data with new data from the first resource based on the dynamic schedule.

20. The data caching system of claim 19 wherein the attribute of the data is a level of privacy for the data so that the data in the data cache is refreshed based upon the level of privacy of the data.

* * * * *